United States Patent [19]

Haley

[11] Patent Number: 5,506,756
[45] Date of Patent: Apr. 9, 1996

[54] TAPE BGA PACKAGE DIE-UP/DIE DOWN

[75] Inventor: Kevin Haley, San Jose, Calif.

[73] Assignee: Intel Corporation, Santa Clara, Calif.

[21] Appl. No.: 391,253

[22] Filed: Feb. 17, 1995

Related U.S. Application Data

[63] Continuation of Ser. No. 187,627, Jan. 25, 1994, abandoned.

[51] Int. Cl.⁶ ........................................... H01R 23/68
[52] U.S. Cl. ...................... 361/789; 257/693; 257/778; 257/786
[58] Field of Search ........................... 257/691, 693, 257/778, 779, 786, 787; 361/767, 774, 789, 807

[56] References Cited

U.S. PATENT DOCUMENTS

| | | | |
|---|---|---|---|
| 5,065,921 | 9/1991 | Lin et al. | 357/74 |
| 5,216,278 | 6/1993 | Lin et al. | 257/688 |
| 5,222,014 | 6/1993 | Lin | 361/792 |
| 5,239,198 | 8/1993 | Lin et al. | 257/693 |
| 5,249,101 | 9/1993 | Frey et al. | 361/717 |
| 5,311,402 | 5/1994 | Kobayashi et al. | 361/707 |

*Primary Examiner*—Gregory D. Thompson
*Attorney, Agent, or Firm*—Blakely, Sokoloff, Taylor & Zafman

[57] ABSTRACT

A ball grid array (BGA) package which contains an integrated circuit die that is directly mounted to either a heat sink or a printed circuit board. In one embodiment, the package has an integrated circuit with surface pads that are coupled to a flexible circuit board. Solder balls are attached to the flexible circuit board and solder the BGA package to a printed circuit board. The flexible circuit has an opening that exposes the integrated circuit and allows the IC to be soldered to the printed circuit board by solder balls attached directly to the surface pads of the IC die. The direct attachment between the die and printed circuit board increases the number of IC output pins. The flexible circuit board and die are covered by a protective injection molded plastic housing. In a second embodiment, the integrated circuit die is flipped upside down and a surface of the die is exposed through the plastic housing. A heat sink can be attached to the exposed die surface to improve the thermal performance of the package.

4 Claims, 3 Drawing Sheets

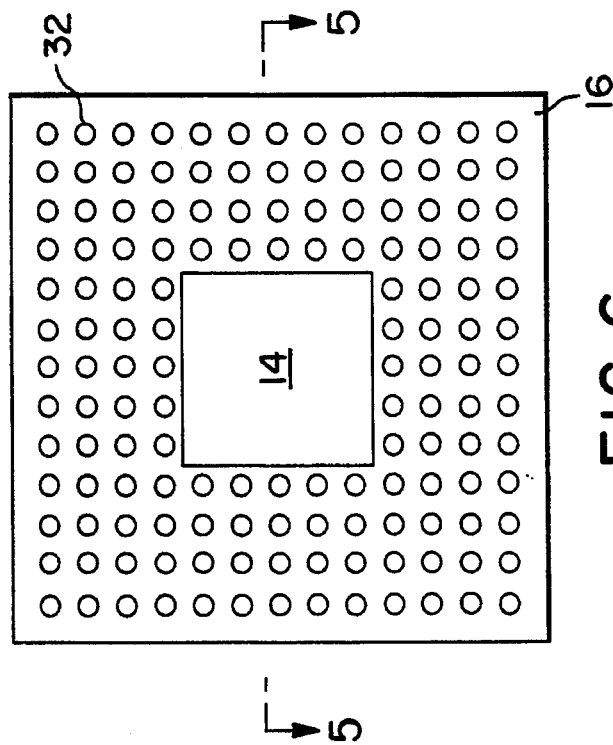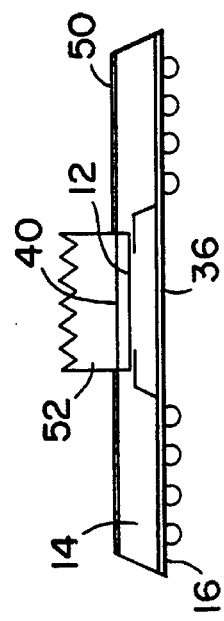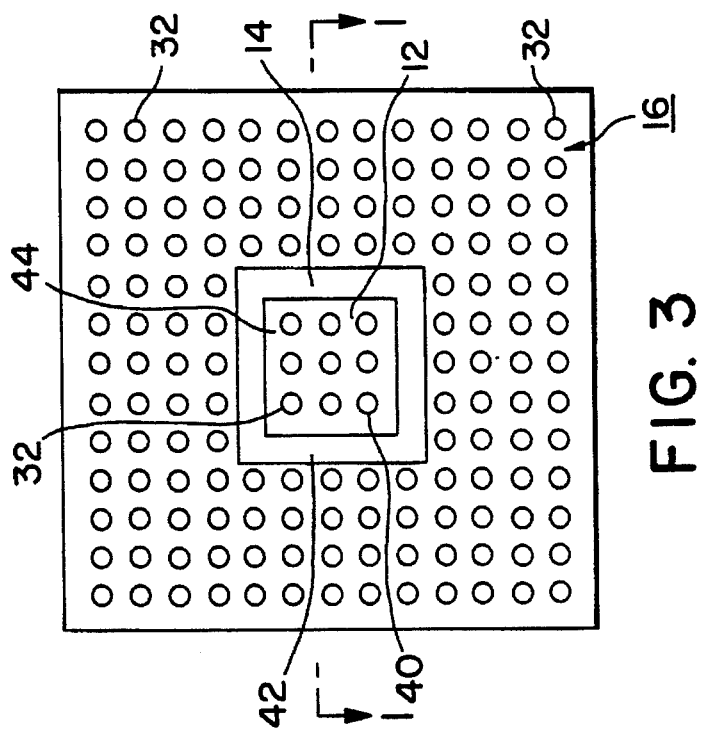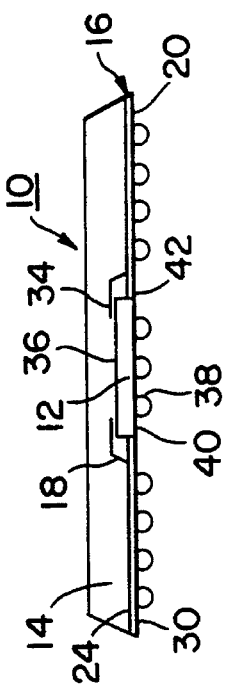

TAPE BGA PACKAGE DIE-UP/DIE DOWN

This is a continuation of patent application Ser. No. 08/187,627 filed Jan. 25 1994, now abandoned.

BACKGROUND OF THE INVENTION

1. Field of the Invention

The present invention relates to a package for an integrated circuit.

2. Description of Related Art

Integrated circuits are typically housed within a package that is mounted to a printed circuit board. The package has conductive leads or pins that are soldered to the printed circuit board and coupled to the integrated circuit by a lead frame. One type of conventional IC package is a quad flat pack (QFP), which has a plurality of gull wing shaped leads that extend from each side of the package housing. The outward extension of the gull wing leads, allows the leads to be readily soldered and inspected after assembly to the printed circuit board. The gull wing shape of the leads also compensates for any deviation in flatness between the printed circuit board and the package.

Another common type of package is a pin grid array (PGA) which has a matrix of output pins across the bottom surface of the package. The pin grid array increases the I/O of the package. PGA packages are difficult to inspect and may result in poor solder joints, if there is a discrepancy in the length of the pins and/or the flatness in the package or printed circuit board.

U.S. Pat. Nos. 5,045,921 and 5,216,278 issued to Lin et al., disclose an integrated circuit package which has a plurality of solder balls that interconnect the package to a printed circuit board. The Lin package is commonly referred to as a ball grid array (BGA). The solder balls are attached to a polyimide based flexible circuit board which has a number of conductive traces and accompanying solder pads. The IC die is connected to the solder pads of the flexible circuit by wire bonds, and electrically coupled to the solder balls through conductive traces routed across the flexible circuit. Vias are formed in the polyimide to interconnect each side of the flexible circuit.

The integrated circuit die of the Lin packages are mounted to a substrate and enclosed by a rigid housing or lid, typically constructed from a molded plastic material. The solder balls are relatively flexible and can thus compensate for any lack of flatness in the printed circuit board or package. Additionally, the solder balls are assembled in a an array on the bottom of the package, and thus provide a relatively high throughput.

Newly developed integrated circuits are continually designed with larger I/O and power requirements than existing ICs. These requirements necessitate packages that are more thermally efficient and have a larger number of output pins. It would be desirable to have BGA packages which are thermally efficient and provide more I/O, than packages in the prior art.

SUMMARY OF THE INVENTION

The present invention is a ball grid array (BGA) package which contains an integrated circuit die that is directly mounted to either a heat sink or a printed circuit board. In one embodiment, the package has an integrated circuit with surface pads that are coupled to a flexible circuit board. Solder balls are attached to the flexible circuit board and the integrated circuit. The center balls solder the BGA package to a printed circuit board. The flexible circuit has an opening that exposes the integrated circuit and allows the IC to be soldered to the printed circuit board by solder balls attached directly to the surface pads of the IC die. The direct attachment between the die and printed circuit board increases the number of IC output pins. The flexible circuit board and die are covered by a protective injection molded plastic housing. In a second embodiment, the integrated circuit die is flipped upside down and a surface of the die is exposed through the plastic housing. A heat sink can be attached to the exposed die surface to improve the thermal performance of the package.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a cross-sectional view of an integrated circuit package of the present invention;

FIG. 3 is a bottom view of the package of FIG. 1;

FIG. 5 is cross-sectional view showing an alternate embodiment of the package of FIG. 1;

FIG. 6 is a bottom view an alternate embodiment of the package in FIG. 5.

DETAILED DESCRIPTION OF THE INVENTION

Figure 2:
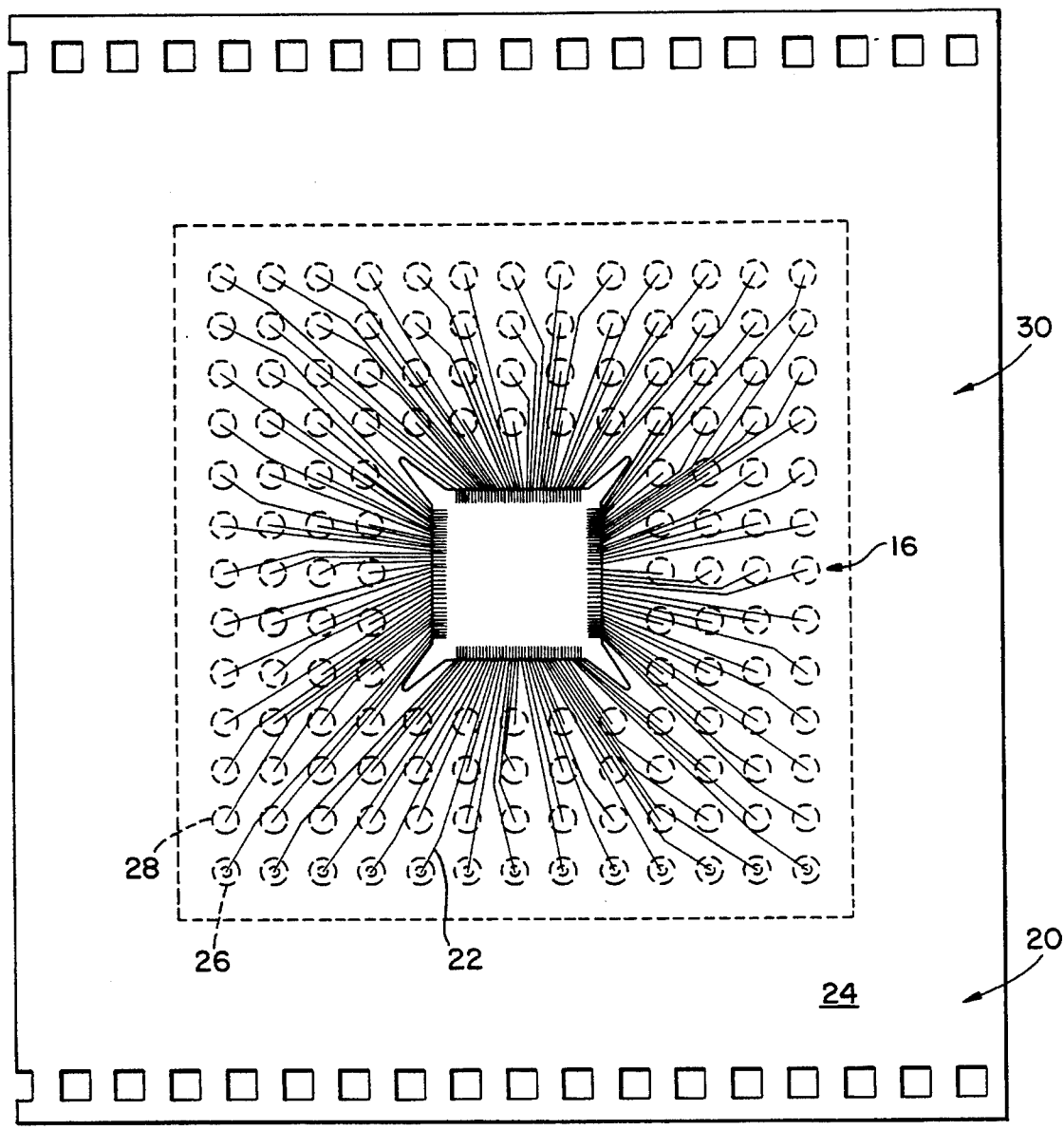
FIG. 2 is a top view of a flexible circuit board of the package.

Referring to the drawings more particularly by reference numbers, FIG. 1 shows an integrated circuit package 10 of the present invention. The package 10 contains an integrated circuit die 12 within a housing 14. The integrated circuit 12 may be a microprocessor, a memory device, etc. The housing is constructed from a plastic material preferably injection molded into the configuration shown. The package 10 is typically mounted to a printed circuit board (not shown) which can couple the integrated circuit to other electrical components, as is known in the art.

The package 10 has a flexible circuit board 16 that is coupled to the integrated circuit 12 by bonded wires 18. As shown in FIG. 2, the circuit board 16 is typically constructed and cut from a flexible polyimide tape material 20. The flexible circuit board 16 has a plurality of conductive lines 22 on a first surface 24 of the tape 20. The lines 22 terminate at Vias 26 which extend through the tape 20 to surface pads 28 located on the second surface 30 of the flexible circuit board 16.

As shown in FIG. 3, attached to each surface pad 28 is a solder ball 32. The solder balls 32 are typically soldered to the surface pads of a printed circuit board (not shown), by mounting the package 10 to the circuit board and reflowing the solder. The solder balls 32 are preferably constructed from a relatively resilient material such as a 60:40 lead-tin composition, 62:36:2 lead-tin-silver composition or an indium alloy. The resilient nature of the solder balls 32 allows the solder joints to withstand the stresses created within the joints. Stresses are created when the package and printed circuit board have different coefficients of thermal expansion and the overall assembly is exposed to varying temperatures. The thermal cycling of the assembly causes the printed circuit board and package to expand and contract at different rates, thereby creating stress in the solder joint.

As shown in FIG. 1, the wires 18 are bonded to the traces 22 of the tape 16 and first surface output pads 34 located on a first surface 36 of the IC die 12. Alternatively the surface pads 34 of the die 12 can be coupled to the tape 16 by conventional TAB (tape automated bonding) tape. The die 12 also has a plurality of second surface output pads 38 located on a second opposite surface 40 of the integrated circuit 12. As shown in FIG. 3, the flexible circuit board 16 has an opening 42 that exposes the second surface 40 of the die 12. The opening 42 allows solder balls 32 to be attached to the second surface pads 38 of the integrated circuit 12. The solder balls 32 located on the die 12 directly couple the integrated circuit 12 to the printed circuit board (not shown) and increase the I/O of the IC. A solder mask 44 preferably covers the portion of the second surface 40 around the solder balls 32. The solder mask 44 environmentally protects the integrated circuit, strengthens the solder joints, and prevents solder from cross-flowing and creating a short circuit between solder joints.

The solder balls 32 and second surface output pads 38 not only increase the number of pins of the package 10, but also increase the number of output pins on the integrated circuit itself. The additional pins can be dedicated to ground or power thereby increasing the number of data signals that can be routed to the IC through the top surface pads 34 of the die 12.

Figure 4:
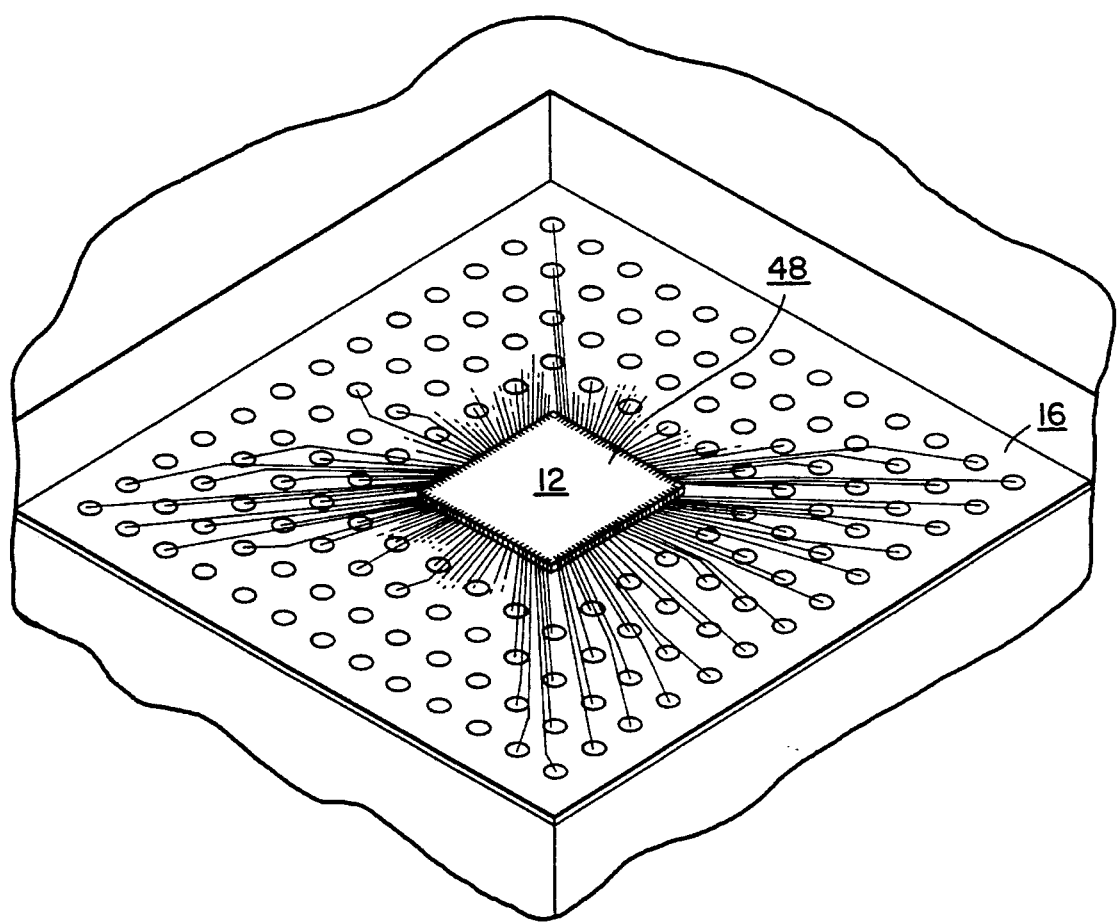
FIG. 4 is a perspective view showing the package being assembled.

FIG. 4 shows a method for assembling the package 10. The integrated circuit 12 is first wire bonded to the flexible circuit board 16. The die 12 and flexible circuit 16 are then placed in a mold 48, such that the flexible circuit 16 and second surface 40 of the integrated circuit 12 are lying on the surface of the mold 48. The mold 48 is then filled with a plastic material, which cures and forms the housing 14. The solder mask 44 is applied to the second surface 40 of the die in a manner that only exposes the second surface pads 38. The solder balls 34 are then attached to the second solder pads 28 of the flexible circuit 16 and the second surface pads 38 of the integrated circuit 12. The flexible circuit board 16 is then trimmed to the edge of the housing 14 to finish the package 10. The cured housing material 14 provides enough stiffness to structurally support the integrated circuit 12, there is no need to mount the die 12 to a substrate as required in packages in the prior art.

FIGS. 5 and 6 show an alternate embodiment of the package, wherein the integrated circuit 12 is rotated so that the first die surface 36 is facing in the same direction as the solder balls 32. The second die surface 40 is exposed through the top surface 50 of the housing 14. The exposed second surface 40 can be readily cooled through either natural or forced convection means. A heat sink 52 can be mounted directly to the second surface 40 to increase the thermal performance of the package.

The package shown in FIGS. 5 and 6 can be constructed similar to the package shown in FIG. 4. The second die surface 40 is placed onto the mold 48. The mold 48 has a feature that would support the flexible circuit 16 above the die 12. The mold 48 is filled with a plastic material, which cures to form the housing 14. A solder mask 44 may be applied to the die 12 to cover the second surface 40. The solder mask 44 can also be applied to the second surface of the flexible circuit board 16 to protect the surface pads 28 and solder balls 32.

What is thus provided are BGA packages that are more thermally efficient and have a greater throughput than BGA packages in the prior art.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:

an integrated circuit which has a first surface that has a plurality of first surface pads and an opposite second surface that has a plurality of second surface pads;

a housing which extends around said integrated circuit such that said second surface of said integrated circuit is exposed, said housing having a first surface and an opposite second surface that is essentially coplanar with said exposed second surface of said integrated circuit;

a tape attached to said second surface of said housing, said tape having a plurality of conductive traces that are coupled to said first surface pads of said integrated circuit, said tape further having an opening that exposes said second surface of said integrated circuit; and, a plurality of solder balls coupled to said conductive traces of said tape and said second surface pads of said exposed second surface of said integrated circuit.

2. The electronic package as recited in claim 1, wherein said housing is constructed from a molded plastic material.

3. The electronic package as recited in claim 1, further comprising a solder mask on said second surface of said integrated circuit.

4. The electronic package as recited in claim 1, further comprising a plurality of wires that couple said integrated circuit to said conductive traces of said tape.

* * * * *